(12) United States Patent
Lee et al.

(10) Patent No.: US 6,548,409 B1
(45) Date of Patent: Apr. 15, 2003

(54) METHOD OF REDUCING MICRO-SCRATCHES DURING TUNGSTEN CMP

(75) Inventors: Shyh-Dar Lee, Hsinchu Hsien (TW); Chun-Feng Nien, Hsinchu Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/076,395

(22) Filed: Feb. 19, 2002

(51) Int. Cl.[7] .............................................. H01L 21/302
(52) U.S. Cl. ........................ 438/692; 438/693; 438/785; 438/424; 257/770
(58) Field of Search ................................ 438/424, 427, 438/436, 584, 692, 693, 785; 257/770

(56) References Cited

U.S. PATENT DOCUMENTS 6,060,370 A * 5/2000 Hsia et al. .................. 438/424
6,313,039 B1 * 11/2001 Small et al. ................. 438/693

FOREIGN PATENT DOCUMENTS

| JP | 10-284596 A | * 10/1998 | ......... H01L/21/768 |
| JP | 10-362753 | * 7/2000 | ....... H01L/21/3205 |

* cited by examiner

Primary Examiner—Kamand Cuneo
Assistant Examiner—Lisa Kilday
(74) Attorney, Agent, or Firm—Birch, Stewart, Kolasch & Birch, LLP

(57) ABSTRACT

A method of reducing micro-scratches during tungsten CMP. Tungsten CMP with a standard tungsten slurry is first provided on the exposed surfaces of a tungsten plug and a IMD layer on a semiconductor substrate. The tungsten CMP with an oxide slurry is then provided on the polished surfaces of the tungsten plugs and the IMD layer.

6 Claims, 6 Drawing Sheets

METHOD OF REDUCING MICRO-SCRATCHES DURING TUNGSTEN CMP

BACKGROUND OF THE INVENTION

1. Field of the Invention

The present invention relates to chemical-mechanical polishing (CMP) and, more particularly, to a method of reducing micro-scratches during tungsten CMP.

2. Description of the Related Art

In the fabrication of semiconductors such as very large scale integrated (VLSI) or ultra-large scale integrated (ULSI) circuits, a high degree of surface planarity is an important factor in forming high-density devices using a photolithographic operation. Especially when the fabrication of semiconductors reaches the sub-half-micron stage, chemical-mechanical polishing (CMP) method has become one of the principle means of global planarization in VLSI or ULSI production.

CMP is a preferred method of planarizing tungsten interconnects, vias and contacts. In tungsten CMP processing, a highly selective polish rate for tungsten as compared to the dielectric is allowed for over-polishing while still achieving a flat tungsten stud. However, wafer defects during polishing, such as micro-scratches, which may cause short or open circuits in the inter-metal dielectric (IMD) layer of via structure must still be overcome. The prior art teaches various methods of controlling the micro-scratches by the proper manufacturing of the abrasive particles in slurry and the proper mixing sequence of the abrasive particles with the suspension agent in slurry. Unfortunately, prior CMP slurries have not been as effective as needed.

FIGS. 1A to 1D are sectional views showing a conventional tungsten CMP process. First, as shown in FIG. 1A, a semiconductor substrate 10 has a plurality of first conductive layers 12 and an IMD layer 14 of silicon oxide formed on the first conductive layers 12. Then, as shown in FIG. 1B, using anisotropic dry etching, a plurality of via structures 16 are formed in the IMD layer 14 to expose the tops of the first conductive layers 12, respectively. Next, as shown in FIG. 1C, a second conducive layer 18 of tungsten (W) metal is deposited on the IMD layer 14 to fill the via structures 16 till reaching a predetermined thickness. Finally, as shown in FIG. 1D, in etching back the second conductive layer 18, CMP is applied to polish the second conductive layer 18 to obtain a planar surface. Thus, the second conductive layer 18 remaining in the via structure 16 serves as a tungsten plug 19.

In tungsten CMP processing, a slurry containing colloidal silica or dispersed aluminum mixed with basic solution, such as KOH or NH4OH solution, is employed. The interaction between the abrasive particles within the slurry and the surface of the IMD layer 14 produces small undesirable micro-scratches on the polished surface. Unfortunately, portions of a metal layer in subsequent processing become trapped within the IMD layer 14, resulting in poor performance of the finished semiconductor device. For example, the "trapped" portion of the metal layer may produce a short circuit condition within the finished device, or undesirably high electrical leakage between adjacent metal lines. In addition, if the IMD layer 14 is also removed in the tungsten CMP process, an oxide layer erosion and a tungsten plug recess will happen due to an over-polishing.

In order to solve the micro-scratches problem, one conventional method is to develop soft slurry without abrasive particles, such as soft silica-gel like compositions. However, use of the soft slurry encounters problems of poor uniformity, decreased wafer throughput, increased process cost, and control difficulties. Another method is to tune the CMP recipe or modify the CMP steps. But, how to develop an available CMP recipe or step still challenge engineers in worldwide.

SUMMARY OF THE INVENTION

The present invention provides a method of reducing micro-scratches during tungsten CMP to solve the problems caused in the prior art.

The method of the present invention provides a novel tungsten CMP on a semiconductor substrate having at least a tungsten plug and an IMD layer. First, the tungsten CMP with a standard tungsten slurry is provided on the exposed surfaces of a tungsten plug and a IMD layer. Tungsten CMP with an oxide slurry is then provided on the polished surfaces of the tungsten plugs and the IMD layer.

Accordingly, it is a principle object of the invention to use the oxide slurry to reduce micro-scratches in the tungsten CMP.

It is another object of the invention to reduce micro-scratches in the tungsten CMP to prevent a short circuit condition within the finished device.

Yet another object of the invention is to reduce micro-scratches in the tungsten CMP to prevent undesirably high electrical leakage between adjacent metal lines.

It is a further object of the invention to reduce micro-scratches in the tungsten CMP by an easily controlled process.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
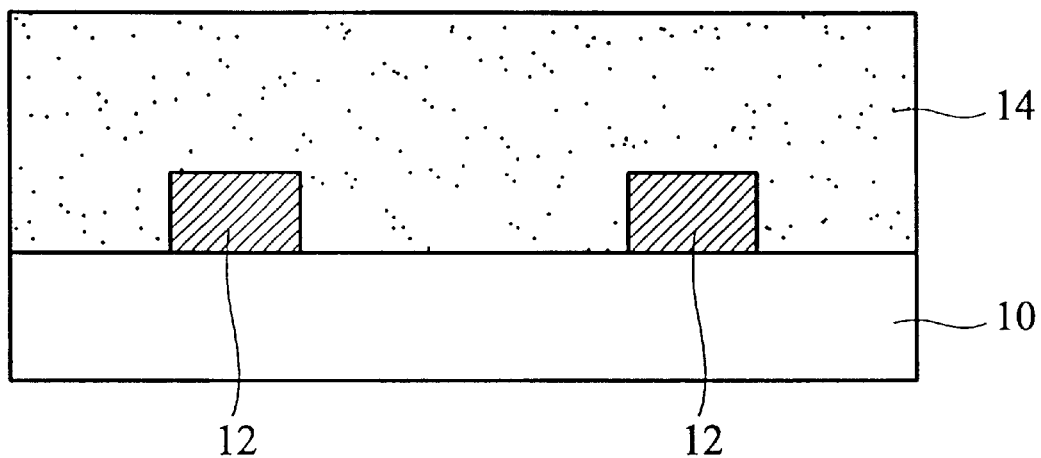
FIGS. 1A to 1D are sectional views showing a conventional tungsten CMP process.
Figure 1B:
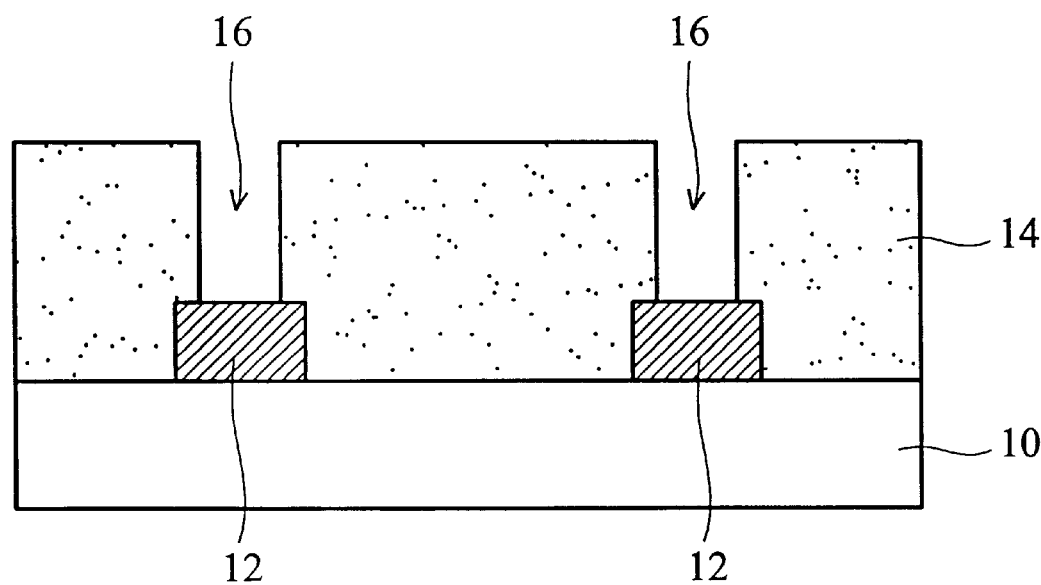
Figure 1C:
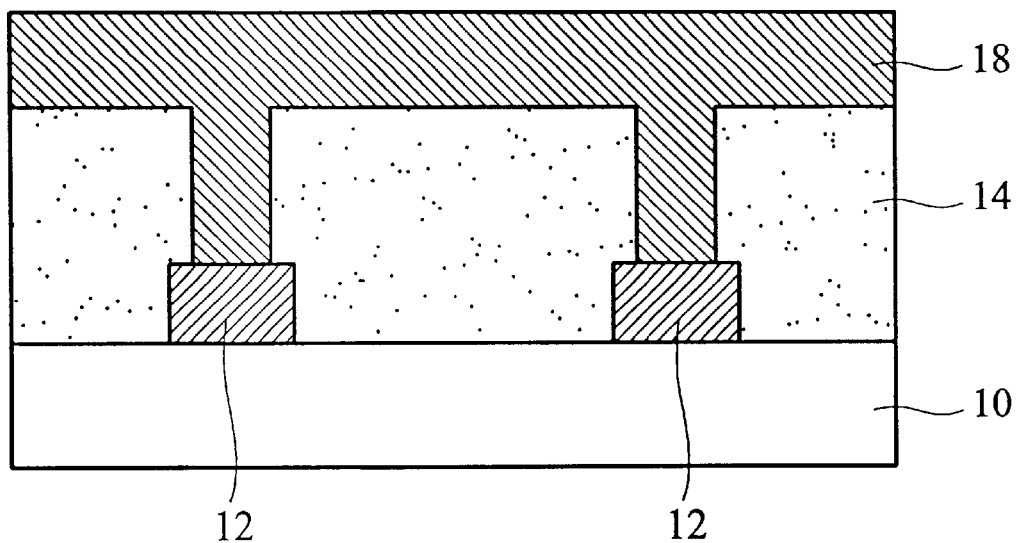
Figure 1D:
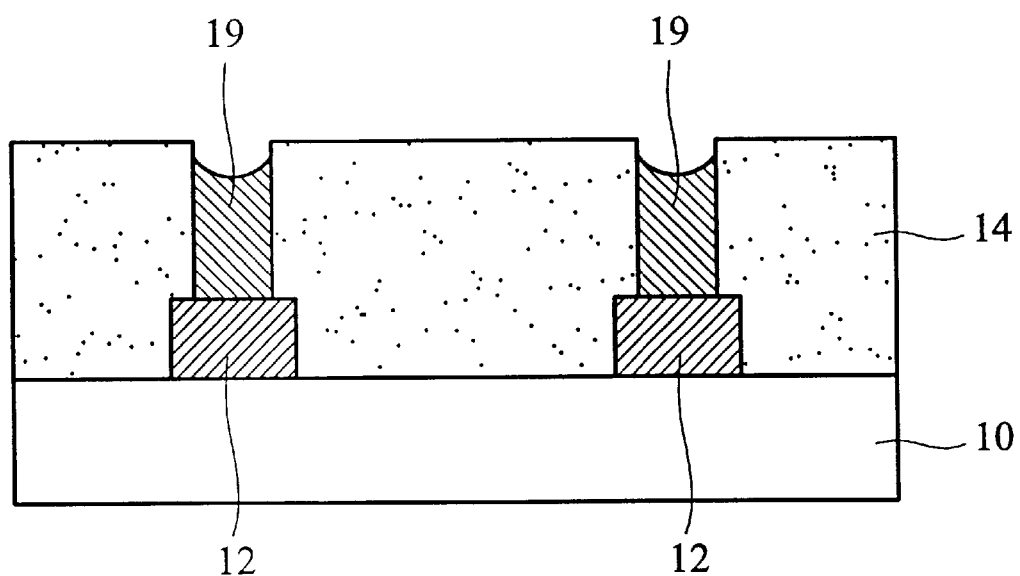
Figure 2A:
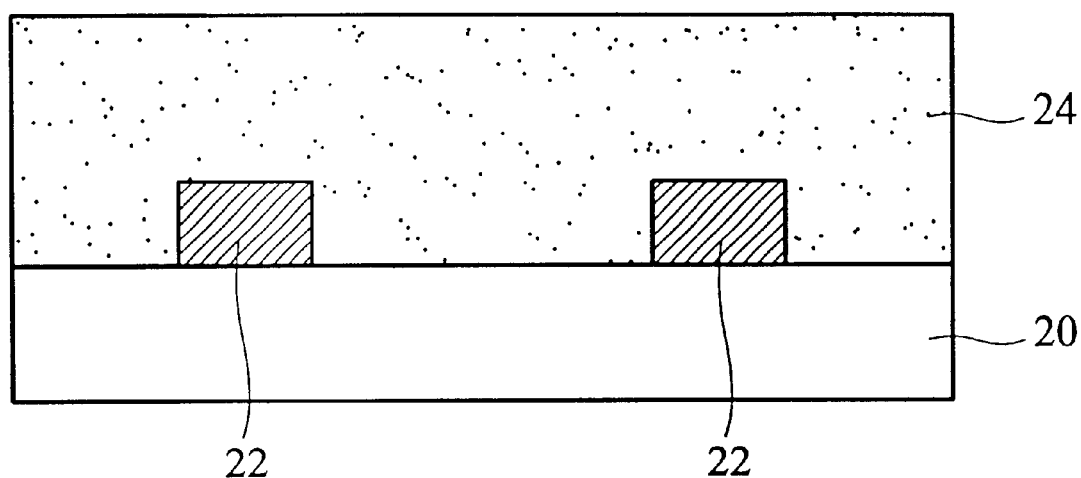
FIGS. 2A to 2G are sectional views showing a tungsten CMP process according to the present invention.
Figure 2B:
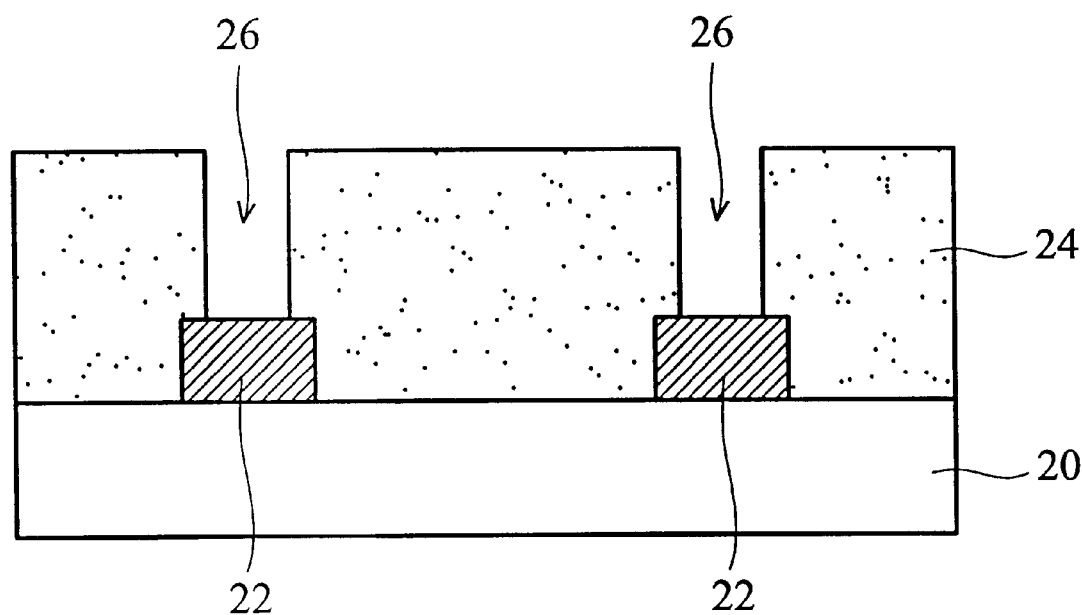
Figure 2C:
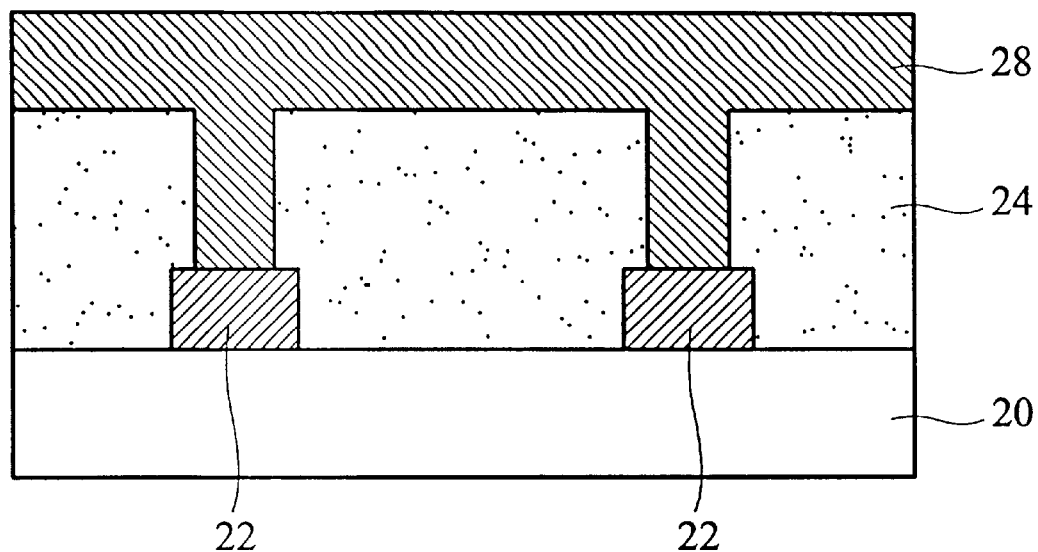

FIGS. 2A to 2G are sectional views showing a tungsten CMP process according to the present invention. First, as shown in FIG. 2A, a semiconductor substrate 20 has a plurality of first conductive layers 22 and an IMD layer 24 formed on the first conductive layers 22. Then, as shown in FIG. 2B, using anisotropic dry etching, a plurality of via structures 26 are formed in the IMD layer 24 to expose the tops of the first conductive layers 22, respectively. Next, as shown in FIG. 2C, a tungsten (W) layer 28 is deposited on the IMD layer 24 to fill the via structures 26 till reaching a predetermined thickness.

Figure 2D:
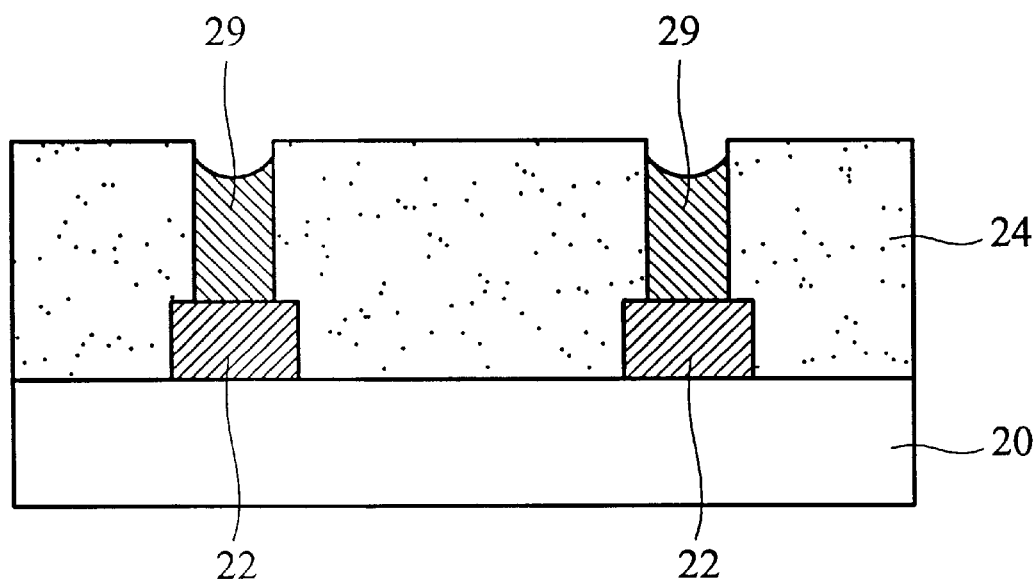
Figure 2E:
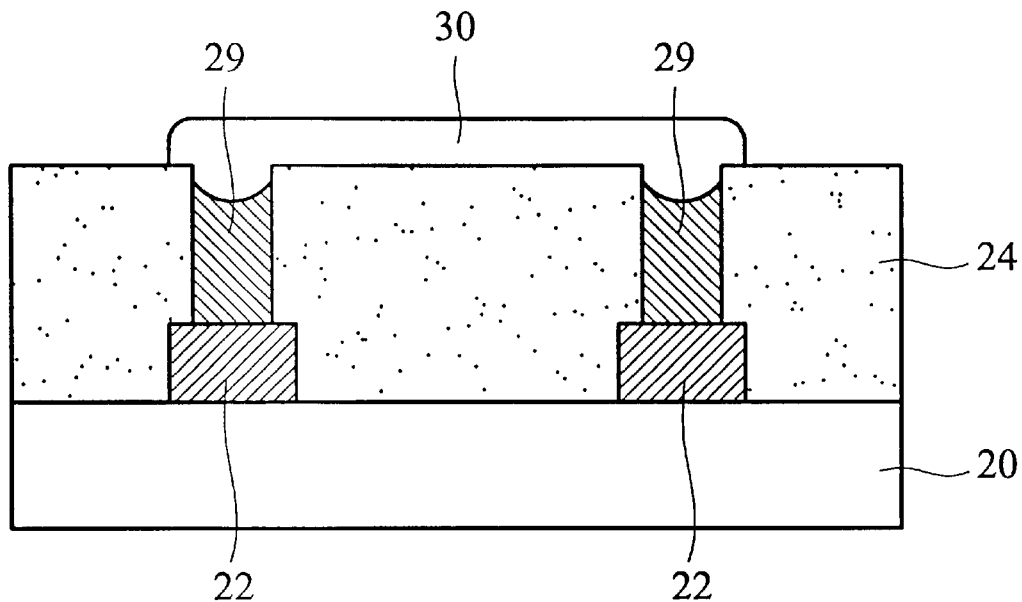
Figure 2F:
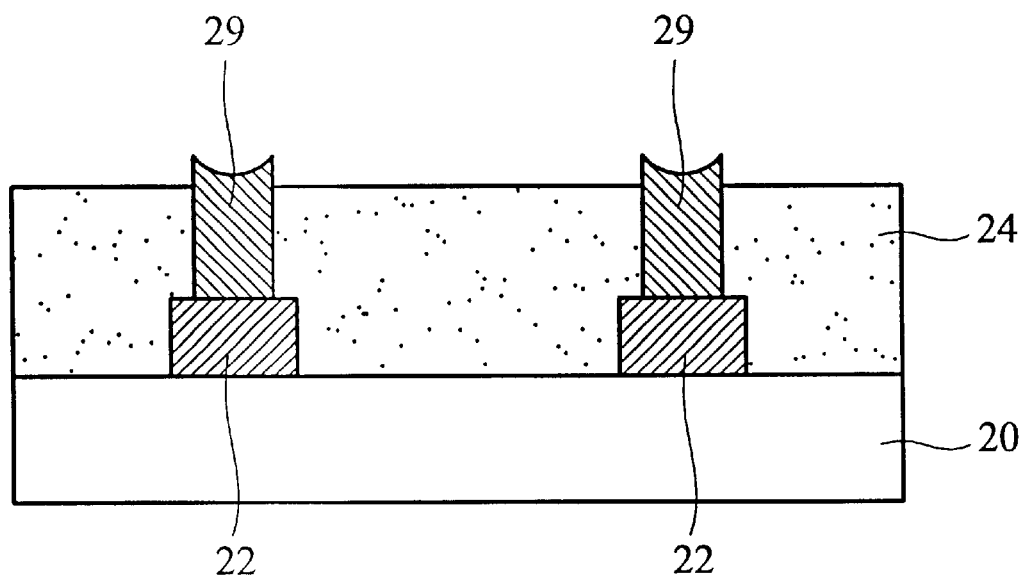
Figure 2G:
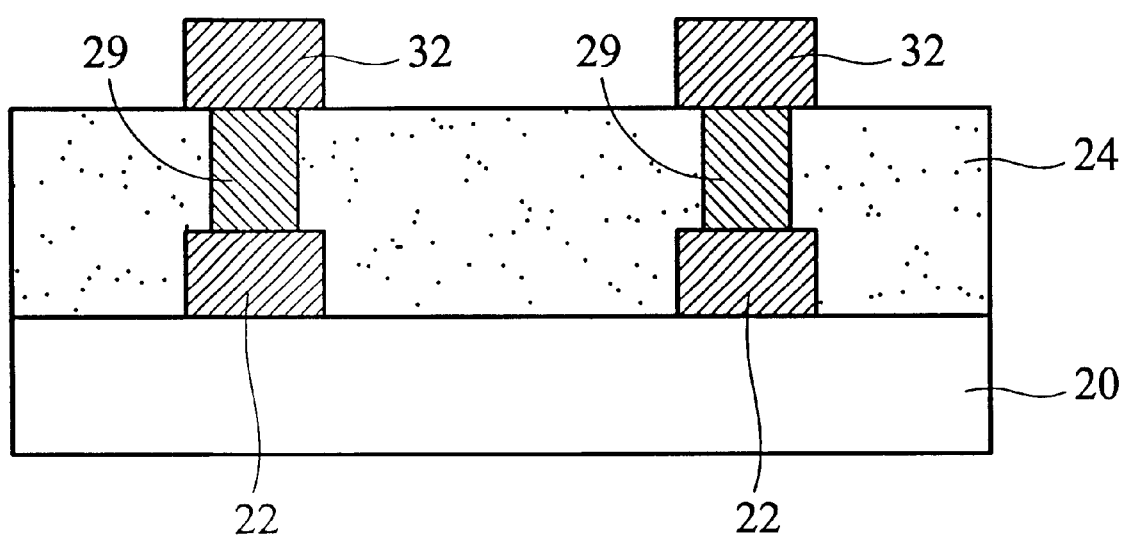

Thereafter, as shown in FIG. 2D, in etching back the tungsten layer 28, a tungsten CMP is applied to polish the tungsten layer 28 for leveling off the surfaces of the tungsten layer 28 and the IMD layer 24. Thus, the tungsten layer 28 remaining in the via structure 26 serves as a tungsten plug 29. During the tungsten CMP process, the standard tungsten slurry of acidity, including SiO2, H2O2, WOX and other chemical components, has an abrasive effect on the polished surface. After the tungsten CMP, micro-scratches caused by the abrasive effect are found on the polished surface of the IMD layer 24. To alleviate the induced damage to the processing surface, post-polish buffing is employed. As shown in FIG. 2E, in a like oxide buffing process, an oxide slurry 30 of alkalinity, containing NH4OH, also called Fuse film, is used to reduce the number of micro-scratches from the polished surface of the IMD layer 24. When the oxide slurry 30 is completed, the top of the IMD layer 24 is lowered at the same time, as shown in FIG. 2F. Thus, the tungsten plugs 29 protrude from the IMD layer 24. Finally, as shown in FIG. 2G, a second conductive layer 32 is deposited and patterned on the planarized surface of the IMD layer 24 to electrically connect to the tungsten plug 29.

Compared with the tungsten CMP in the prior art, the present invention provides the oxide slurry 30 in the post-polish step of tungsten CMP to reduce the number of micro-scratches from the polished surface. This prevents both a short circuit condition within the finished device and undesirably high electrical leakage between adjacent metal lines, so as to ensure electrical performance of the finished semiconductor device. Also, since the oxide slurry 30 is added after the standard polishing step of providing the standard tungsten slurry, none of new materials and steps are needed in the standard polishing step. Furthermore, the tungsten CMP of the present invention is easy to control to achieve increased wafer throughput.

It is to be understood that the present invention is not limited to the embodiments described above, but encompasses any and all embodiments within the scope of the following claims.

What is claimed is:

1. A method of reducing micro-scratches during tungsten CMP, comprising steps of:
   providing a semiconductor substrate having at least a tungsten plug and an inter-metal dielectric (IMD) layer;
   performing tungsten CMP with a standard tungsten slurry on the exposed surfaces of the tungsten plugs and the IMD layer; and
   performing tungsten CMP with an oxide slurry on the polished surfaces of the tungsten plugs and the IMD layer.

2. The method according to claim 1, wherein the standard tungsten slurry provides an abrasive effect on the polished surface.

3. The method according to claim 1, wherein the standard tungsten slurry is acidic composition.

4. The method according to claim 1, wherein the oxide slurry provides an oxide buffing procedure on the polished surface.

5. The method according to claim 1, wherein the oxide slurry is alkaline.

6. The method according to claim 1, wherein the semiconductor substrate comprises:
   a first conductive layer patterned on the semiconductor substrate and covered by the IMD layer;
   a via structure passing through the IMD layer to expose the first conductive layer; and
   a tungsten layer formed on the IMD layer and filling the via structure, wherein the tungsten layer in the via structure serves as the tungsten plug.

* * * * *